United States Patent
Camuffo

(10) Patent No.: US 7,443,247 B2
(45) Date of Patent: Oct. 28, 2008

(54) CIRCUIT ARRANGEMENT FOR DETECTION OF A LOCKING CONDITION FOR A PHASE LOCKED LOOP, AND A METHOD

(75) Inventor: Andrea Camuffo, München (DE)

(73) Assignee: Infineon Technologies AG, Munich (DE)

(*) Notice: Subject to any disclaimer, the term of this patent is extended or adjusted under 35 U.S.C. 154(b) by 71 days.

(21) Appl. No.: 11/506,508

(22) Filed: Aug. 18, 2006

(65) Prior Publication Data

US 2007/0040614 A1 Feb. 22, 2007

(30) Foreign Application Priority Data

Aug. 19, 2005 (DE) .................. 10 2005 039 352

(51) Int. Cl.
*H03L 7/085* (2006.01)
(52) U.S. Cl. .................. 331/1 A; 331/11; 331/DIG. 2; 327/156
(58) Field of Classification Search .............. 331/1 A, 331/DIG. 2, 11; 327/156
See application file for complete search history.

(56) References Cited

U.S. PATENT DOCUMENTS

| | | | | |
|---|---|---|---|---|
| 5,126,690 A | * | 6/1992 | Bui et al. | .......... 331/1 A |
| 6,222,400 B1 | * | 4/2001 | Fukuda et al. | .......... 327/151 |
| 6,621,354 B1 | * | 9/2003 | Kornblum et al. | .......... 331/14 |
| 6,670,834 B1 | * | 12/2003 | Swanson | .......... 327/156 |
| 2006/0067454 A1 | | 3/2006 | Camuffo | |

FOREIGN PATENT DOCUMENTS

| EP | 0 550 360 A1 | 7/1993 |
|---|---|---|
| JP | 58171131 A | 10/1983 |

\* cited by examiner

*Primary Examiner*—Robert J. Pascal
*Assistant Examiner*—Levi Gannon
(74) *Attorney, Agent, or Firm*—Eschweiler & Associates, LLC

(57) ABSTRACT

A circuit arrangement includes a phase locked loop, having a phase detector on whose output side a phase signal can be tapped off and whose output side is coupled to a charge pump. Furthermore, the phase locked loop includes an oscillator whose input side is coupled to the charge pump and which is coupled at one output for emission of an oscillator signal to a first input of the phase detector. The circuit arrangement further includes a counter whose input side is supplied with an input signal which can be derived from the phase signal, and which is coupled to the output of the oscillator. The counter emits an output signal from the counter as a function of a value which represents a pulse length of the phase signal.

24 Claims, 6 Drawing Sheets

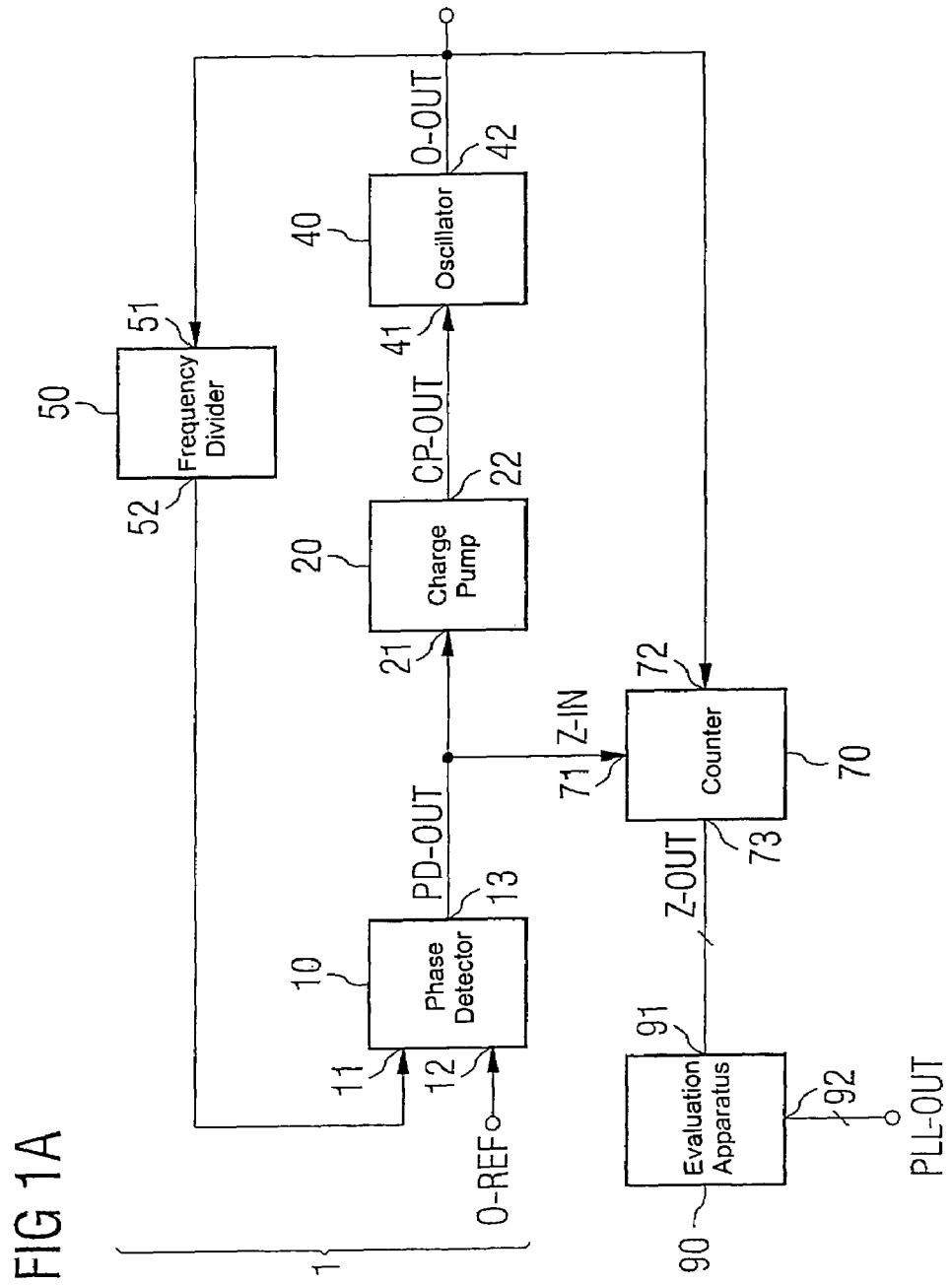

CIRCUIT ARRANGEMENT FOR DETECTION OF A LOCKING CONDITION FOR A PHASE LOCKED LOOP, AND A METHOD

REFERENCE TO RELATED APPLICATIONS

This application claims the benefit of the priority date of German application DE 10 2005 039 352.7, filed on Aug. 19, 2005, the contents of which are herein incorporated by reference in their entirety.

FIELD OF THE INVENTION

The present invention relates to the field of electronics and in particular to a circuit arrangement for detection of a locking condition of a phase locked loop. The invention is further directed to use of the circuit arrangement and to a method for determination of a locked state of a phase locked loop.

BACKGROUND OF THE INVENTION

Phase locked loops, or PLLs for short, are frequently used in order to produce signals at a stable frequency. For example, phase locked loops are used in transmitting arrangements for stationary or mobile communication purposes. In some transmission methods, a transmission signal is frequency-modulated. In this case, a phase locked loop can be used to produce a frequency which is stable in places.

Conventional phase locked loops have a phase detector, a charge pump and an oscillator in the forward path. One output of the oscillator is connected to one input of the phase detector in order to form a backward path.

Once a phased locked loop has settled in a state with a stable frequency after being switched on, it is referred to as being locked.

Phase locked loops exist, which are referred to as Type I phase locked loops, and have a loop filter with a non-integrating transfer function. Other phase locked loops are referred to as Type II phase locked loops, and have a loop filter with an integrating characteristic. In the case of Type I phase locked loops, monitoring is normally carried out to determine whether the duty ratio of the charge pump is tending to zero, in order to identify the locked state. A time period in which the charge pump is active, divided by a period duration, can be referred to as the duty ratio. Circuits such as these cannot be used for Type II phase locked loops, since the duty ratio of the charge pump in general differs from zero in this case, even in the locked state.

The aim is for a circuit arrangement to be suitable for detection of a locking condition for a phase locked loop of both the integrating type and the non-integrating type. The aim is for one method to allow determination of a locked state of a phase locked loop.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

In one embodiment, a circuit arrangement for detection of a locking condition of a phase locked loop comprises a phase locked loop which has a phase detector for production of a phase signal at an output. The arrangement further comprises a charge pump which is coupled at one input to the output of the phase detector, and an oscillator which is coupled at one input to an output of the charge pump and at an output to a first input of the phase detector, and emits an oscillator signal at the output. Furthermore, the circuit arrangement has a counter which has an input for supplying an input signal which can be derived from the phase signal, a clock input which is coupled to the output of the oscillator, and a connection for emitting an output signal from the counter as a function of a value which represents the pulse length of the phase signal. In addition, the circuit arrangement has an evaluation apparatus which has a first connection which is coupled to the counter, and forms a first difference between a first pulse length of a first pulse and a second pulse length of a second pulse which follows the first pulse. The evaluation apparatus compares the first difference with an adjustable limit value D, forms at least one further difference between the first pulse length and at least one further pulse length of at least one further pulse which follows the second pulse in time, and compares at least a further difference with the adjustable limit value D. The evaluation apparatus emits the output signal from the evaluation apparatus with a value which represents a locked state of the phase locked loop if the first difference and the at least one further difference are less than an adjustable limit value D.

In another embodiment, a circuit arrangement comprises a phase locked loop which has a phase detector configured to produce a phase signal at an output, a charge pump coupled at one input to the output of the phase detector, and an oscillator coupled at an input to an output of the charge pump. The oscillator emits an oscillator signal at the output. The arrangement further includes a frequency divider, which is connected at an input to an output of the oscillator, and at a first output to the first input of the phase detector. In addition, the circuit arrangement comprises a counter, which has an input configured to receive an input signal which can be derived from the phase signal, a clock input coupled to the output of the oscillator, and a connection configured to emit an output signal from the counter as a function of a value which represents the pulse length of the phase signal. In addition, the circuit arrangement has an evaluation apparatus, which has a first connection coupled to the connection of the counter, and is operable to compare the difference between the pulse lengths of successive pulses with an adjustable limit value D. A logic unit is also included which has a first input coupled to the output of the phase detector or to the output of the charge pump, a second input, coupled to a second output of the frequency divider, and a connection configured to emit an output signal from the logic unit.

In an alternative embodiment, a circuit arrangement comprises a phase locked loop having a phase detector, a charge pump connected downstream from the phase detector, and an oscillator connected downstream from the charge pump and coupled on the output side to a first input of the phase detector. In addition, the circuit arrangement comprises a counter configured to count the cycles of an oscillator signal from the oscillator while a signal which is derived from a phase signal from the phase detector is at a stable logic level or an approximately stable analog level, and configured to output a pulse length of the phase signal. Furthermore, the circuit arrangement comprises an evaluation apparatus, which compares at least two differences between the pulse lengths of successive pulses with an adjustable limit value D.

In one embodiment, a method is provided for determination of the locked state of a phase locked loop, comprising determining of a first number N of cycles of an oscillator signal from an oscillator, while an input signal which is derived from a phase signal from a phase detector exceeds a first threshold value. The method further comprises determining at least two further numbers L, L' of cycles of the oscillator signal, while the input signal exceeds the first threshold value and comparing the first number N and the at least two further numbers L, L' and producing an output signal from the evaluation apparatus having a first value which represents a locked state of the phase locked loop if each of the at least two further numbers L, L' differs from the first number N by less than an adjustable limit value D. A second value is provided which represents a non-locked state of the phase locked loop, as soon as one of the at least two further numbers L, L' differs from the first number N by the adjustable limit value D or by more than the adjustable limit value D. Alternatively, a determination of a second number M of cycles of the oscillator signal is made while the input signal which is derived from the phase signal from the phase detector is below a second threshold value. A determination is made of at least two further numbers K, K' of cycles of the oscillator signal, while the input signal is below the second threshold value and a comparison is made of the second number M and of the at least two further numbers K, K'. An output signal is then produced from the evaluation apparatus having a first value which represents a locked state of the phase locked loop if each of the at least two further numbers K, K' differs from the second number M by less than an adjustable limit value D. The evaluation apparatus further has a second value which represents a non-locked state of the phase locked loop, as soon as one of the at least two further numbers K, K' differs from the second number M by the adjustable limit value D or by more than the adjustable limit value D.

In an alternative embodiment, a method is provided for determining a locked state of a phase locked loop, which has a phase detector, a charge pump, an oscillator and a frequency divider. The method comprises supplying a delayed signal, which is delayed with respect to a signal which the frequency divider produces during frequency division of an oscillator signal, to a logic unit and supplying an input signal which is derived from a phase signal from the phase detector, to the logic unit. An output signal is produced by the logic unit, having a first value if the input signal assumes a value which represents the charge pump in a rest state at the time of a pulse of the delayed signal, and having a second value if the input signal assumes a value which represents the charge pump in an active state at the time of a pulse of the delayed signal. The method further comprises determining a first number N of cycles of an oscillator signal of the oscillator while the input signal exceeds a first threshold value, and determining at least one further number L of cycles of the oscillator signal while the input signal exceeds the first threshold value. The first number N and the at least one further number L are compared and an output signal is produced from the evaluation apparatus, having a first value which represents a locked state of the phase locked loop if each of the at least one further number L differs from the first number N by less than an adjustable limit value D, and having a second value which represents a non-locked state of the phase locked loop, as soon as one of the at least one further number L differs from the first number N by the adjustable limit value D or by more than the adjustable limit value D. Alternatively, a determination of a second number M of cycles of the oscillator signal is made while the input signal is below a second threshold value and a determination of at least one further number K of cycles of the oscillator signal is made while the input signal is below the second threshold value. The second number M and the at least one further number K are compared and an output signal from the evaluation apparatus is produced, having a first value which represents a locked state of the phase locked loop if each of the at least one further number K differs from the second number M by less than an adjustable limit value D, and having a second value which represents a non-locked state of the phase locked loop, as soon as one of the at least one further number K differs from the second number M by the adjustable limit value D or by more than the adjustable limit value D.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE INDIVIDUAL DRAWINGS

The invention will be explained in more detail in the following text using a plurality of exemplary embodiments and with reference to the figures, in which:

FIGS. 1A to 1D are block diagrams illustrating circuit arrangements based on various embodiments of the invention.

DETAILED DESCRIPTION OF THE INVENTION

Figure 1B:
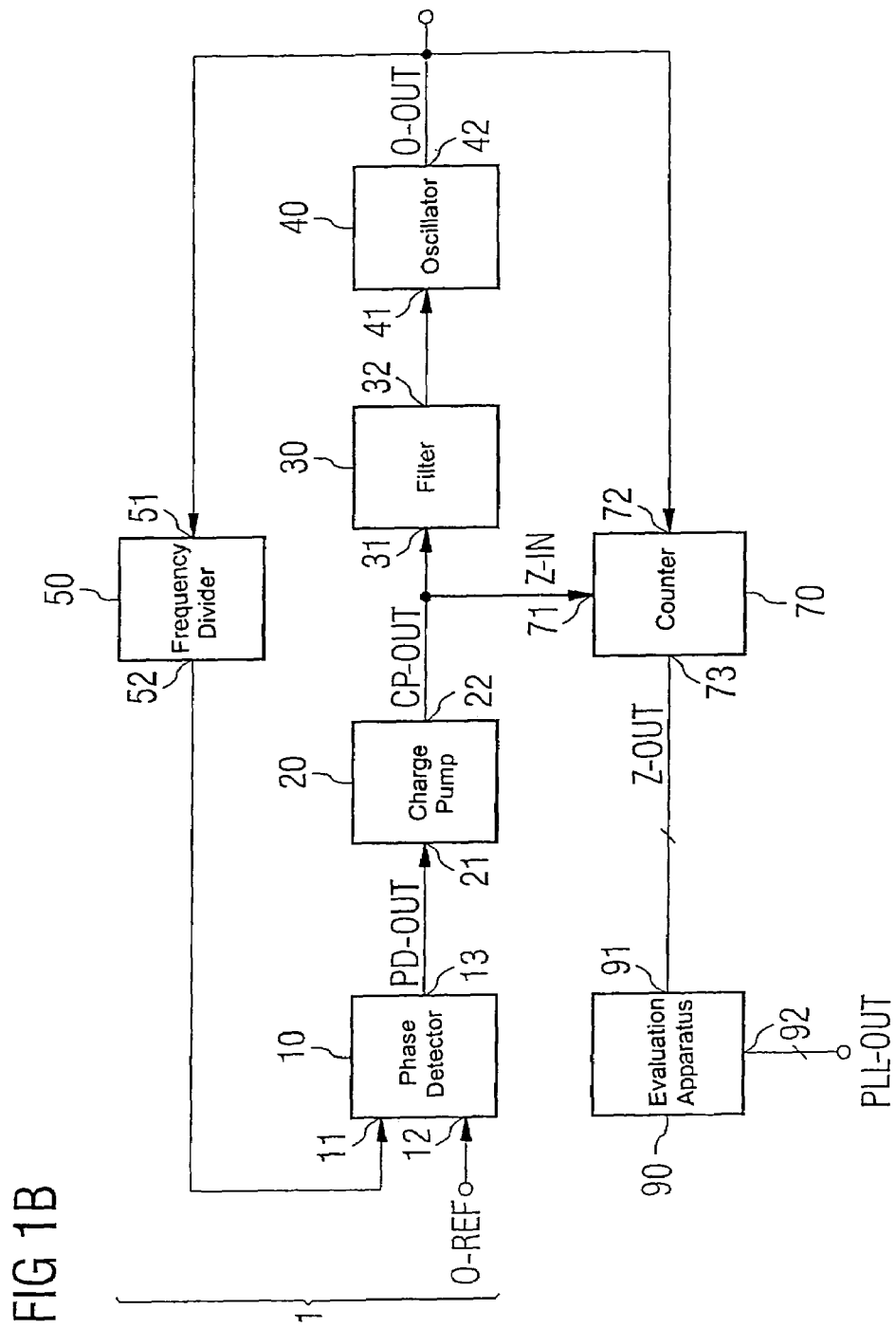

Components having the same function and/or effect have the same reference symbols. Where the components and functions of circuit parts match, their description will not be repeated in each of the following figures.

FIG. 1A shows an example of a circuit arrangement having a phase locked loop based on the proposed principle, having a phase detector 10, followed by a charge pump 20 and followed by an oscillator 40. The oscillator 40 is linked to the phase detector via a frequency divider 50.

The oscillator 40 is connected at an output 42 to one input 51 of the frequency divider 50. The frequency divider 50 is linked at a first output 52 to a first input 11 of the phase detector 10. One output 13 of the phase detector 10 is connected to one input 21 of the charge pump 20. One output 22 of the charge pump 20 is coupled to one input 41 of the oscillator 40.

The output 13 of the phase detector 10 is connected to a first input 71 of a counter 70. The output 42 of the oscillator 40 is connected to a clock input 72 of the counter 70. One connection 73 of the counter 70 is connected to a first input 91 of an evaluation apparatus 90.

An oscillator signal O-OUT can be tapped off at the output 42 of the oscillator 40. The oscillator signal O-OUT is supplied via the frequency divider 50 to the first input 11 of the phase detector 10. A reference oscillator signal O-REF from a reference oscillator which is not illustrated can be applied to a second input 12 of the phase detector 10.

The phase detector 10 is used to determine any phase difference between the oscillator signal O-OUT which has been divided down by means of the frequency divider 50, and the reference oscillator signal from the reference oscillator O-REF. If there is any phase difference, then the phase signal PD-OUT which is produced at the output 13 of the phase detector 10 is not equal to zero for the duration of the phase difference.

The phase signal PD-OUT controls the current or the voltage emitted from the charge pump 20, and thus influences the oscillator 40, which is used to emit the oscillator signal O-OUT. The oscillator signal O-OUT may be at a radio frequency.

The phase detector 10, the charge pump 20 and the reference oscillator can thus be designed for considerably lower frequencies than the oscillator 40.

If the phase signal PD-OUT at the output 13 of the phase detector 10 is now above an upper threshold value, then the counter 70 counts the pulses of the oscillator signal O-OUT. An output signal Z-OUT from the counter 70 can thus represent a first number N of pulses.

One advantage of this arrangement is that the activity of the charge pump 20 is determined effectively, and a signal which represents the activity of the charge pump 20 is made available at the output 73 of the counter 70.

The evaluation apparatus 90 is designed to emit an output signal PLL-OUT from the evaluation apparatus 90 at an output 92, as a function of the output signal Z-OUT from the counter 70.

One advantage of this circuit arrangement is that the evaluation apparatus 90 is designed to compare a number of successive values of the output signal Z-OUT from the counter 70 with one another and to use this comparison to determine whether the phase locked loop is or is not locked. Since locking identification is not dependent on a single counting process, locking can advantageously be determined with a high degree of confidence.

Alternatively, the pulses of the oscillator signal O-OUT are counted when the signal at the output 22 of the charge pump 20 is below a lower threshold value. An output signal Z-OUT from the counter 70 can be tapped off at one output 73 of the counter 70. An output signal Z-OUT from the counter 70 can then represent a second number M of pulses.

In another embodiment of the counter 70, an output signal Z-OUT from the counter 70 can represent a time period tCP1 for the activity of the charge pump 20, or for the non-activity of the charge pump 20. In yet another embodiment, an output signal Z-OUT from the counter 70 can represent the ratio α between the active time tCP1 of the charge pump 20 and the clock time T.

FIG. 1B shows an alternative embodiment of the circuit arrangement with a phase locked loop 1 based on the proposed principle.

In contrast to the phase locked loop 1 shown in FIG. 1A, the charge pump 20 in the phase locked loop 1 shown in FIG. 1B is connected to the oscillator 40 via a filter 30. The charge pump 20 is connected at the output 22 of the charge pump 20 to one input 31 of the filter 30. One output 32 of the filter 30 is once again connected to the input 41 of the oscillator 40.

In contrast to the circuit arrangement shown in FIG. 1A, the output 22 of the charge pump 20 in the circuit arrangement shown in FIG. 1B is connected to the input 71 of the counter 70.

In this embodiment, the output signal CP-OUT from the charge pump 20, which can be tapped off at the output 22 of the charge pump 20, forms the input signal Z-IN, which is applied to the input 71 of the counter 70.

The phase signal PD-OUT controls the charge pump such that the charge pump 20 is switched to be active for one logic value of the phase signal PD-OUT, and the charge pump 20 is switched to be inactive for another logic value of the phase signal PD-OUT.

The output signal Z-OUT from the counter 70 is thus a function of the output signal CP-OUT from the charge pump 20, and thus of the phase signal PD-OUT. Furthermore, the output signal Z-OUT from the counter 70 is a function of the oscillator signal O-OUT. The output signal Z-OUT from the counter 70 indicates the number of clock cycles of the oscillator signal O-OUT for which the charge pump 20 is active.

The evaluation apparatus 90 is used to determine whether the phase locked loop is or is not locked, and uses the output signal Z-OUT from the counter 70 for this purpose.

Figure 1C:
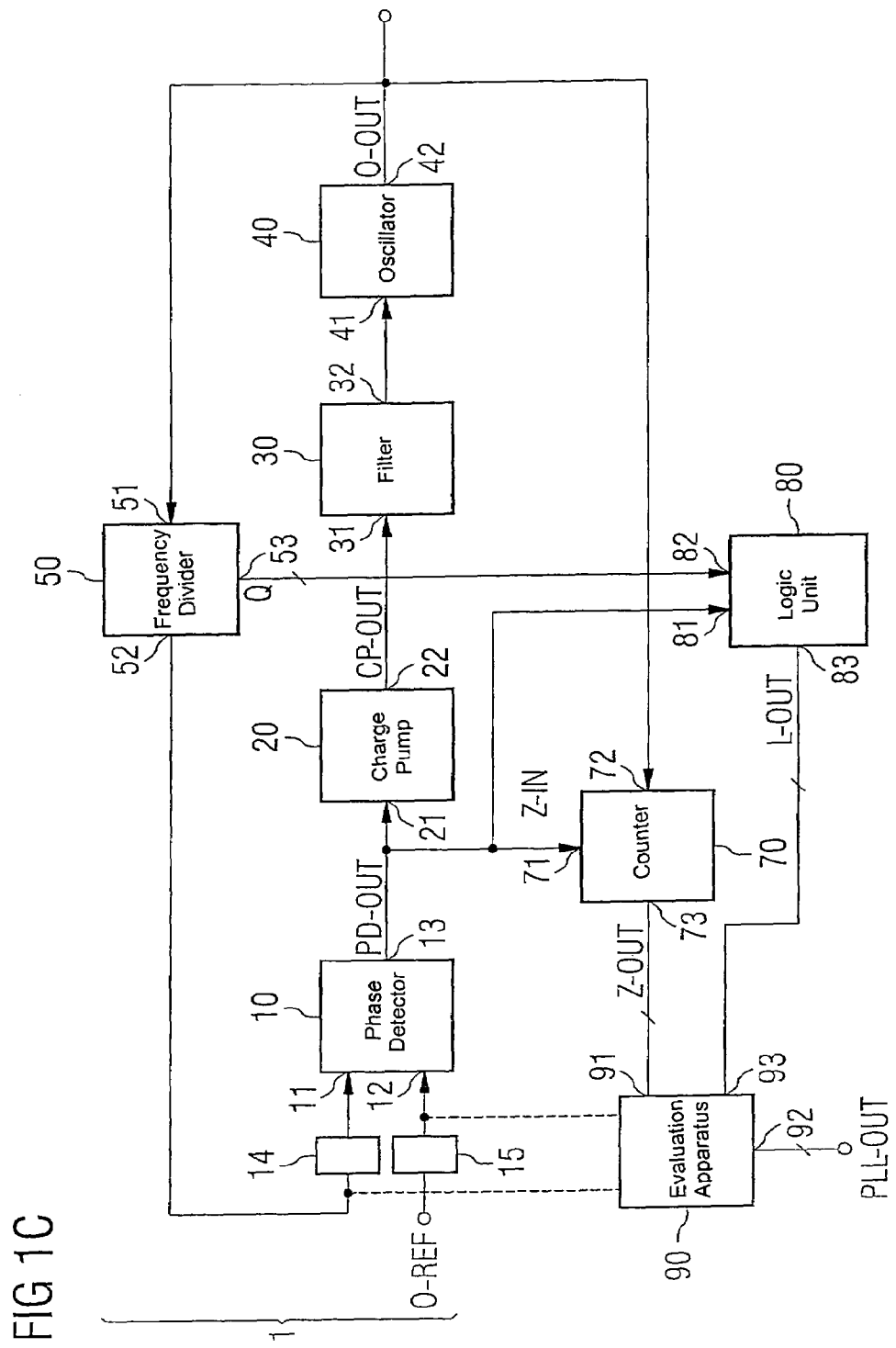

FIG. 1C shows a further alternative embodiment of the circuit arrangement with the phase locked loop 1 based on the invention, and this is a development of the circuit arrangement shown in FIG. 1A. As a supplement to FIG. 1A, the filter 30 is connected between the charge pump 20 and the oscillator 40 in the phase locked loop 1 shown in FIG. 1C.

In addition, a logic unit 80 is provided in the circuit arrangement in FIG. 1C, and is connected at its first input 81 to the output 13 of the phase detector 10, and at its second input 82 to a second output 52 of the frequency divider 50. The logic unit 80 has a connection 83.

A delayed signal Q, which is formed with an adjustable delay based on a signal at the first output 52 of the frequency divider 50, is produced at the second output 53 of the frequency divider 50. The logic unit 80 now compares the delayed signal Q at the second output 53 of the frequency divider 50 with the phase signal PD-OUT. If the phase signal PD-OUT at the time at which there is a pulse in the delayed signal Q at the second connection 53 of the frequency divider 50 is such that the charge pump 20 is switched to the active operating state, then this means that the phase locked loop is not in a locked state. When the phase locked loop is in a locked state, the charge pump 20 is not active at the time of the pulse in the delayed signal Q at the second output 53 of the frequency divider 50.

The value of the adjustable delay of the delayed signal Q at the second output 53 with respect to the signal at the first output 52 of the frequency divider 50 can be set as appropriate. The value of the adjustable delay is shorter in a Type I phase locked loop than in a Type II phase locked loop, assuming that the signal at the first output 52 of the frequency divider 50 is the same.

The phase locked loop shown in FIG. 1C thus makes use of two methods to identify the locked state of the phase locked loop. The counter 70 can be used to identify how the phase locked loop is approaching the locked state. In contrast, the logic unit 80 can be used to determine whether the charge pump 20 is active for greater than or less than an adjustable value.

The phase locked loop in FIG. 1C has an evaluation apparatus 90 which is connected at a first and a third connection 91, 93 to the connection 73 of the counter 70 and, respectively, to the connection 83 of the logic unit 80. The evaluation apparatus 90 has a second connection 92 for emitting a signal, or alternatively for emitting and receiving signals.

The evaluation apparatus 90 in the phase locked loop shown in FIG. 1C is thus supplied with the output signal Z-OUT from the counter 70, and with the output signal L-OUT from the logic unit 80. A computation unit can thus be provided in the evaluation apparatus 90, with an algorithm which determines whether the phase locked loop is in the locked state or the non-locked state on the basis of these values. Alternatively, the evaluation apparatus has analog elements and digital gates for calculation purposes.

The output signal PLL-OUT from the evaluation apparatus 90 can be tapped off at the second connection 92 of the evaluation apparatus 90. The output signal PLL-OUT from the evaluation apparatus 90 may include information that the phase locked loop 1 is in a locked state or a non-locked state.

The two signals which provide information about the state of the phase locked loop 1 can thus advantageously be linked in a circuit arrangement as shown in FIG. 1C. Information about the locked state or non-locked state can be transferred to a higher-level system which includes the phase locked loop.

Optionally, further connections can be provided from the frequency divider 50 to the logic unit 80 in order to supply further delayed signals, and these can be used to determine the pulse duration of the phase signal PD-OUT more accurately.

The connections between the evaluation apparatus 90 and the counter 70 or the logic unit 80 are in a bidirectional form, in one embodiment. By way of example, this allows the evaluation apparatus 90 to transmit signals to reset the logic unit 80 and/or the counter 70, or other adjustment parameters for the logic unit 80 and/or the counter 70.

The evaluation apparatus 90 can optionally receive a signal by means of connections to the first output 52 of the frequency divider 50 or the second input 12 of the phase detector 10, in order to produce signals to reset the logic unit 80 and/or the counter 70, and/or in order to generate signals to check the output signal Z-OUT from the counter 70 and/or the output signal L-OUT from the logic unit 80.

The output signal PLL-OUT from the evaluation apparatus 90 can be supplied to a processor, which is not shown. The evaluation apparatus 90 can also have information transferred to it from the processor via the second connection 92.

Further, as illustrated in FIG. 1C first and second dividers 14, 15 may be provided at the inputs 12, 13 of the phase detector 10.

Figure 1D:
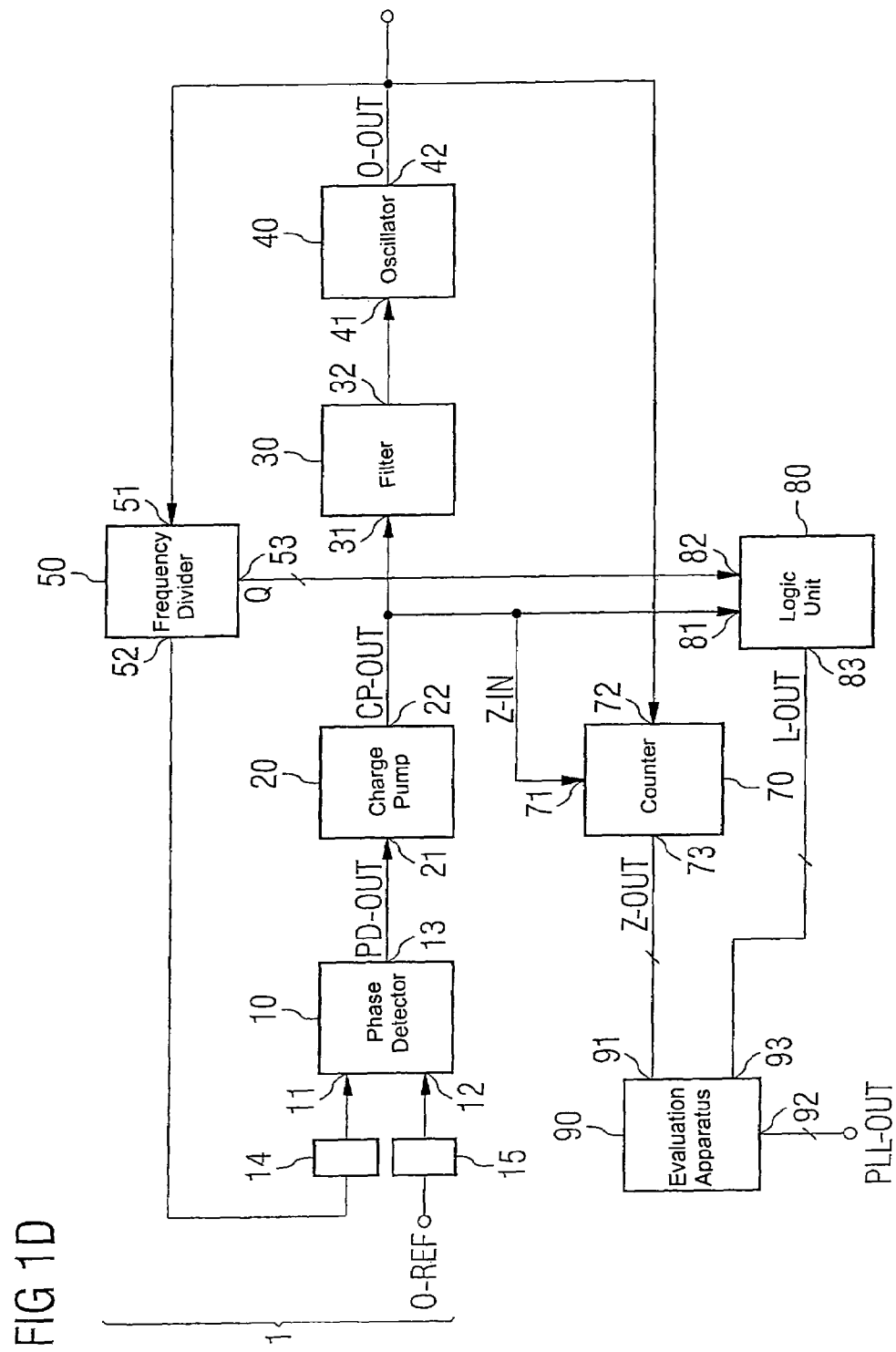

FIG. 1D shows a circuit arrangement which is an alternative embodiment to the circuit arrangement shown in FIG. 1C.

In contrast to the circuit arrangement shown in FIG. 1C, the output 22 of the charge pump 20, at which the output signal CP-OUT of the charge pump 20 can be tapped off, in the circuit arrangement shown in FIG. 1D is connected to the input 71 of the counter 70, and to the first input 81 of the logic unit 80. The pulse length of the output signal CP-OUT from the charge pump 20 is advantageously determined directly in FIG. 1D.

The evaluation unit 90 is advantageously used to determine whether the phase locked loop 1 is in the locked state or the non-locked state.

Figure 2:
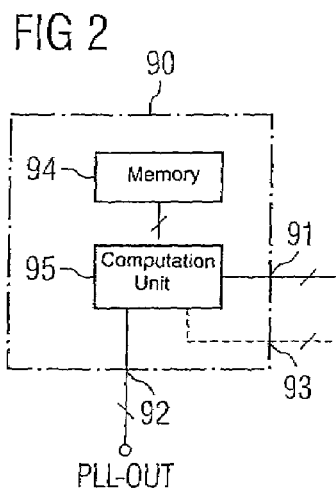
FIG. 2 is a block diagram illustrating one embodiment of an evaluation apparatus of the invention.

FIG. 2 shows one exemplary embodiment of the evaluation apparatus 90, as may be used by way of example in the circuit arrangement shown in FIGS. 1A and 1B.

In this embodiment, the evaluation apparatus 90 has a memory 94 and a computation unit 95, which are coupled to one another. The computation unit 95 is supplied with the signal which is applied to the first connection 91 of the evaluation apparatus 90. The memory 94 can be used to store values and/or to store a program.

The evaluation apparatus 90 uses an algorithm and the setting parameters to determine the state of the phase locked loop, and emits this at the second connection 92 of the evaluation apparatus 90 in the form of the output signal PLL-OUT from the evaluation apparatus 90. Different algorithms can thus advantageously be used to determine whether a phase locked loop is or is not locked, using one circuit arrangement.

The evaluation apparatus 90 optionally has a third connection 93. The computation unit 95 is additionally supplied with the signal which is applied to the third connection 93 of the evaluation apparatus 90. In the optional embodiment, the evaluation apparatus 90 can be used in the circuit arrangements shown in FIGS. 1C and 1D.

Figure 3:
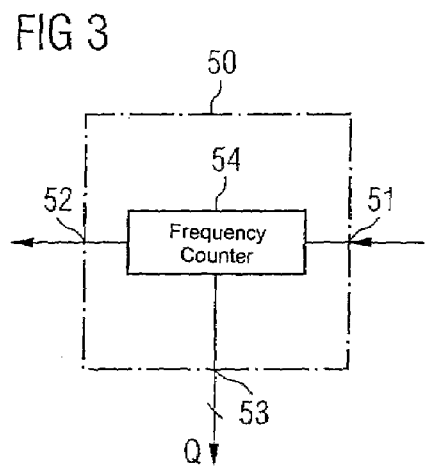
FIG. 3 is a block diagram illustrating one embodiment of a frequency divider of the invention.

FIG. 3 shows one exemplary embodiment of the frequency divider 50 as can be used in the phase locked loop 1 as shown in FIG. 1C or 1D.

In FIG. 3, the frequency divider 50 has a radio-frequency counter 54, whose input side is connected to the input 51 of the frequency divider 50, and whose output side is coupled to the first and the second outputs 52, 53 of the frequency divider 50.

The frequency divider produces a signal at the first output 52 when the radio-frequency counter 54 has reached a first adjustable value, and is then reset. This adjustable value is the division factor which is used to divide the oscillator signal O-OUT which is applied to the input 51.

The frequency divider produces the delayed signal Q at the second output 53. The delayed signal Q has a pulse when the radio-frequency counter 54 has reached a second adjustable value, which is less than the first adjustable value.

Further connections can optionally be provided from the frequency divider 50 to the logic unit 80, in order to supply further delayed signals.

At least one signal Q which has been delayed with respect to the signal at the first output 52 can thus advantageously be made available at the second output 53.

Figure 4:
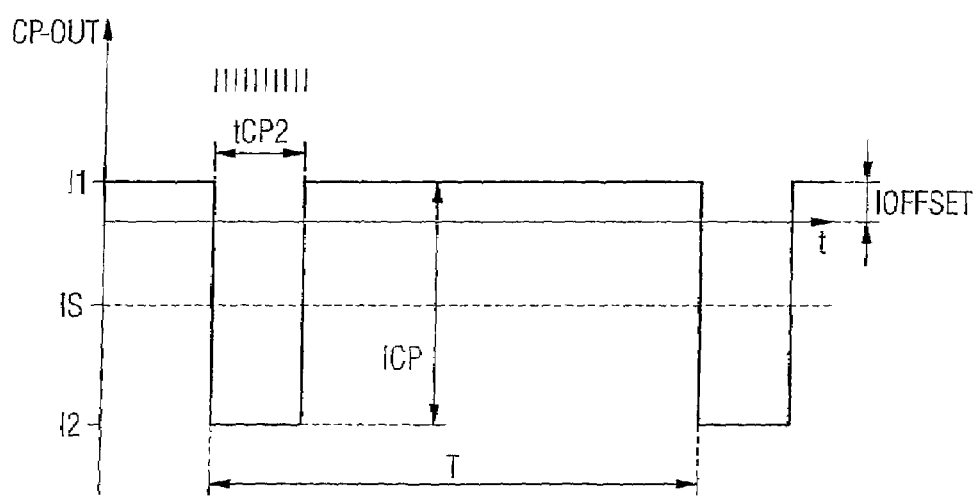
FIG. 4 is a timing diagram illustrating an example of a signal waveform of an output signal from the charge pump as a function of time according to one embodiment of the invention.

FIG. 4 shows an example of the signal waveform of an output signal CP-OUT from the charge pump 20 as a function of the time t.

Throughout a period duration T, the output signal CP-OUT from the charge pump 20 is first of all at a second current value I2, and then at a first current value I1. The absolute magnitude of the first current value I1 is less than the absolute magnitude of the second current level I2.

The period duration T is one period duration of the reference oscillator signal O-REF, which is emitted from the reference oscillator. This period duration T is virtually identical to the period duration of the phase signal PD-OUT which is emitted by the phase detector 10, or to one period duration of the signal at the output 22 of the charge pump 20, or one period duration of the signal at the first output 52 of the frequency divider 50. The frequency fREF is the reciprocal of the period duration of the reference oscillator signal from the reference oscillator, using the formula:

$$T=1/\text{fREF}.$$

In this exemplary embodiment, the second current value I2 is negative and flows during the activity time tCP2, during which the signal CP-OUT is below a lower limit value IS. During the activity time tCP2, a second number M of pulses of the oscillator signal O-OUT can be counted, as is indicated by 10 dashes in FIG. 4. The activity time tCP2 is obtained from the quotient of the second number M pulses divided by the frequency fOSC of the oscillator signal O-OUT using the formula: M/fOSC.

The first current value I1 corresponds to an offset current which flows at the output 22 of the charge pump 20 and flows for a time period which results from any difference between the period duration T and the activity time tCP2 using the formula T−tCP2. The offset current is also referred to as the trickle current.

The duty ratio α results from the ratio of the activity time tCP2 to the period duration T, and can be determined from the first number M and the frequency fOSC of the oscillator signal O-OUT using the formula:

$$\alpha = \frac{tCP2}{T} = \frac{M}{T \cdot fOSC} = \frac{M \cdot fREF}{fOSC}$$

The second number M, the activity duration tCP2 or the duty ratio α can thus advantageously be used to determine the state of the phase locked loop.

Figure 5:
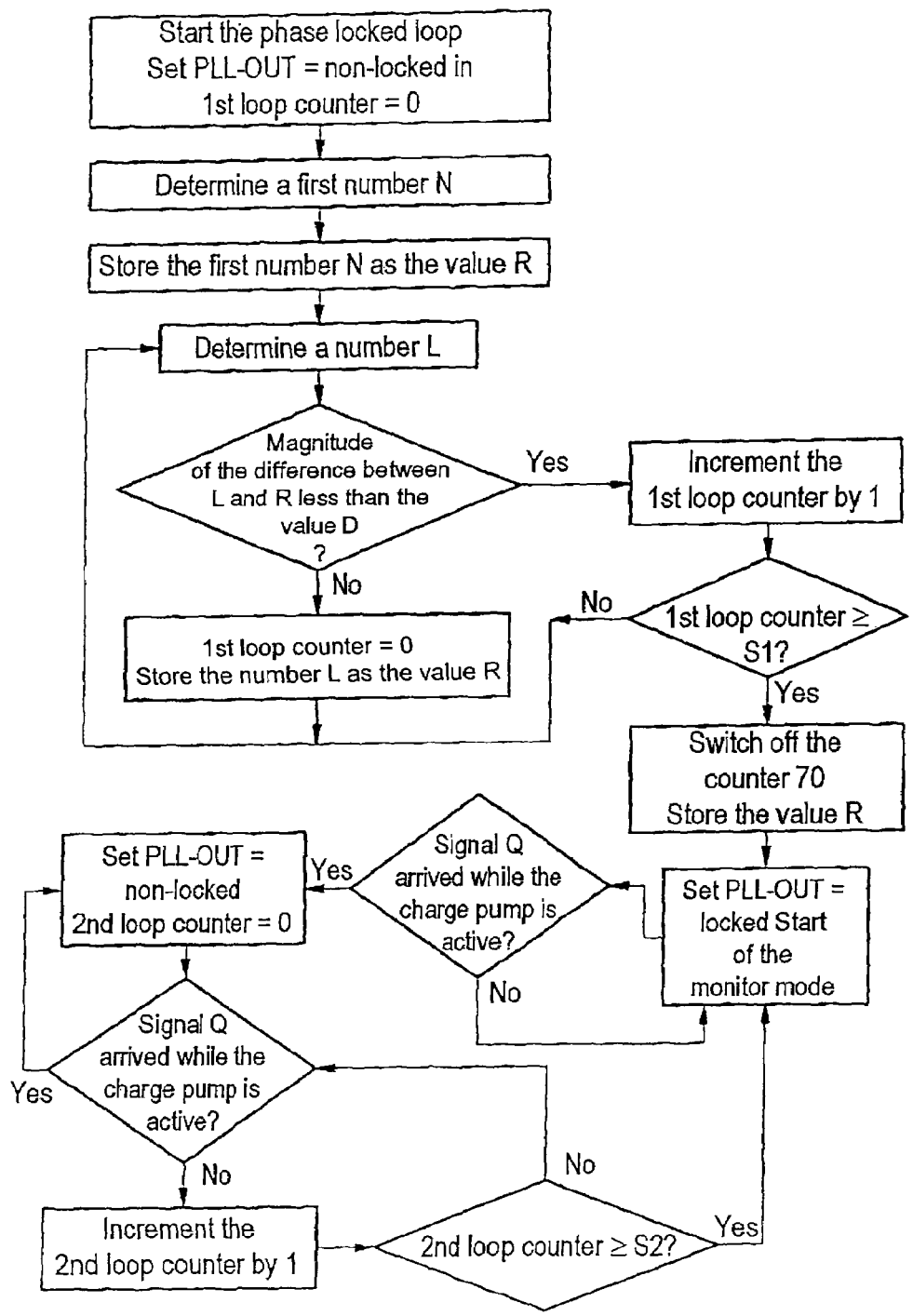
FIG. 5 is a flow chart diagram illustrating one exemplary embodiment for an algorithm to evaluate the state of a phase locked loop according to one exemplary embodiment.

FIG. 5 shows one exemplary embodiment of a flow chart diagram of an algorithm for the evaluation apparatus 90.

A first part of the algorithm monitors whether the phase locked loop 1 is locked. In contrast, a second part of the algorithm, once the phase locked loop 1 is in the locked state, monitors whether the phase locked loop 1 is still in the locked state.

The algorithm first of all assumes an initial state, with a first loop counter being set to zero and the output signal PLL-OUT from the evaluation apparatus 90 being set to a value which represents a non-locked phase locked loop.

The cycles of the oscillator signal O-OUT are then counted while, in one embodiment, the phase signal PD-OUT is in the logic state "1" which switches the charge pump 20 to an active operating state. The first number N is thus determined, and is stored as a value R.

A number L is determined using the same method. The magnitude of the difference between the first number N and the number L is calculated. If this magnitude of the difference is greater than an adjustable limit value D, then the phase locked loop is not yet locked, and the number L is stored as the value R, and the first loop counter is set to zero.

If, in contrast, the magnitude of the difference is less than an adjustable limit value D, then the first loop counter is incremented by 1. If the value of the first loop counter is less than an adjustable third number S1, then a further number L is determined. This process continues until the loop counter is greater than or equal to the third number S1. In this case, the number L of counted oscillator pulses have been measured S times successively, corresponding to the third number S1, with the further number L in each case differing from the value R by less than a limit value D. The phase locked loop 1 is thus defined as being locked, and the output signal PLL-OUT from the evaluation apparatus 90 is set such that it represents a locked phase locked loop 1.

In one embodiment, the counter 70 can then be switched off.

After this, the logic unit 80 is used to monitor whether the activity of the charge pump 20 has ended before the occurrence of a pulse in the delayed signal Q at the second output 53 of the counter 50. If this is the case, the phase locked loop 1 is still locked. If this is not the case, then the phase locked loop 1 is identified as not being locked, and a second loop counter is set to zero.

A further measurement is carried out to determine whether the signal Q at the second connection 53 of the frequency divider 50 occurs during the phase signal PD-OUT. If this is not the case, then the phase locked loop 1 is regarded as still not locked, and the measurement is carried out again.

If the signal Q occurs after the end of the phase signal PD-OUT, the second loop counter is incremented by 1. The second loop counter is checked. If the second loop counter is greater than or equal to an adjustable fourth number S2, then the phase locked loop 1 is regarded as locked again. If the second loop counter is less than the adjustable fourth number S2, then a further measurement is carried out.

If the fourth number S2 of measurements successively indicate that the phase signal PD-OUT has ended before the occurrence of the delayed signal Q, then the phase locked loop 1 is locked.

The evaluation apparatus 90 can thus advantageously determine, in an initial phase, the stability and the locking of the phase locked loop 1 by means of the counter 70, and, in a second phase, the continuation of the locked state of the phase locked loop 1, by means of the logic unit 80.

In one embodiment, the third number S1 is at least 2, so that the number L and at least the further number L' are counted.

In one embodiment, the circuit arrangement has a phase locked loop, a counter and an evaluation apparatus. The phase locked loop has a phase detector, a charge pump and an oscillator. The charge pump is connected between the phase detector and the oscillator. One output of the oscillator is coupled to a first input of the phase detector.

The counter has an input, a clock input and one connection. The clock input of the counter is connected to the output of the oscillator. The evaluation apparatus is connected at a first connection to the connection of the counter.

The oscillator is designed to emit an oscillator signal at the output of the oscillator. The counter is thus supplied with the oscillator signal at the clock input, and with an input signal at the input.

The phase detector is designed to determine any phase difference between the signal at the first input and a signal at a second input of the phase detector. The phase detector is designed to emit a phase signal at the output of the phase detector. The operation of the charge pump is controlled by the phase signal. A pulse at the output of the charge pump thus has approximately the same pulse length as the pulse length of a pulse of the phase signal at the output of the phase detector.

An input signal which can be derived from the phase signal can be supplied to the input of the counter. The counter is designed to emit an output signal at the connection provided for this purpose on the counter. The output signal from the counter indicates the pulse length of the phase signal. In the case of a Type I phase locked loop, the pulse length tends to a value 0. In a Type II phase locked loop, the pulse length approximates to a stable value. In the case of a pulse length 0, the Type I phase locked loop is locked and if the pulse length has a stable value, the Type II phase locked loop is locked. The output signal from the counter can thus be used to determine whether the phase locked loop is in a locked state.

The evaluation apparatus is designed to compare pulse lengths of successive pulses, and to form a difference magnitude. Furthermore, the evaluation apparatus is designed to compare the difference magnitude with an adjustable limit value D again. The evaluation apparatus is designed to detect a locking condition for the phase locked loop by means of the formation of the two comparisons.

One advantage of this circuit arrangement is that the pulse lengths of successive pulses of the phase signal are used to determine locking, with the aid of the counter and the evaluation apparatus. One advantage of the circuit arrangement is that it can be implemented independently of the type of phase locked loop. It is efficient in that one signal which is already provided elsewhere in the system, specifically the oscillator signal, is used as the clock signal for the counter. There is therefore no need to provide a specific oscillator, which would increase the space requirement, for the counter. The oscillator signal is advantageously a radio-frequency signal, so that the value which represents the duty ratio of the phase signal can be determined with high precision.

In one embodiment, the phase locked loop has a filter. The input side of the filter is connected to the output of the charge pump, and its output side is connected to the input of the oscillator. The filter may be a loop filter and may have a low-pass response. The filter may be an active filter, or alternatively a passive filter.

In one embodiment, the filter has a non-integrating transfer function. The phase locked loop can thus be identified as a Type I phase locked loop.

In another embodiment, the filter has an integrating transfer function. The phase locked loop can thus be identified as a Type II phase locked loop.

The phase locked loop can thus include a configuration in which the charge pump has a pulse length of greater than zero even when the phase locked loop is in the locked state. This is referred to as an offset charge pump configuration. A pulse length of greater than 0 can be determined by means of the counter. When the pulse length reaches a stable value, then the phase locked loop is locked.

The input of the counter can be connected to the output of the phase detector. In one embodiment, the phase signal is in the form of a digital signal, and can be counted by means of a counter of simple design.

In an alternative embodiment, the counter can be connected to the output of the charge pump, thus advantageously directly detecting the time period in which the charge pump is emitting an analog signal with a high amplitude or a high pulse level, compared with the amplitude or the pulse level of an offset signal from the charge pump.

In one embodiment, the phase locked loop has a frequency divider which is connected between the oscillator and the phase detector. In this case, one first output of the frequency divider is linked to the first input of the phase detector. The frequency divider is designed to divide a frequency of the oscillator signal. The function blocks downstream from the frequency divider, such as the phase detector and the charge pump, are thus advantageously designed for a lower frequency than the oscillator and the frequency divider.

In one embodiment, the oscillator is a voltage controlled oscillator, or VCO for short.

The charge pump in one embodiment can be designed to charge and/or to discharge at least one capacitor, in order that a voltage which is supplied to the voltage controlled oscillator is set such that the voltage controlled oscillator provides the predetermined frequency on the output side. The at least one capacitor may be included in the charge pump, in the filter or in the voltage controlled oscillator.

In one embodiment, the frequency divider has an adjustable division factor. In this example, the frequency divider is referred to as a multimodulus divider, or MMD for short. The division factor of an MMD can be switched between two or more values.

In one embodiment, the phase locked loop can be designed to operate using a sigma-delta method. In this embodiment, the pulse length of the charge pump may also have a slight fluctuation even in the locked state, and this is referred to as sigma delta jitter. The adjustable limit value D is advantageously chosen to be higher than the slight fluctuation.

A reference oscillator, which is designed to emit a reference oscillator signal, is connected in one example to the second input of the phase detector.

The counter may be a synchronous dual counter or an asynchronous dual counter. In alternative embodiments, the counter may be an asynchronous or a synchronous binary coded decimal counter, or BCD counter for short. The counter may be formed by series-connected flip-flop circuits.

The input signal which is derived from the phase signal (which is produced at the output of the phase detector) from the phase detector can be supplied to the input of the counter. In one embodiment, the phase signal is supplied directly to the counter, as an input signal. In one alternative embodiment, a signal which can be tapped off at the output of the charge pump is supplied to the counter as the input signal.

The signals at the outputs of one or more components in the phase locked loop may be pulses with steep positive and negative flanks. In one embodiment, the signals may be digital signals. Alternatively, the signals at the outputs of one or more components in the phased locked loop may correspond approximately to sinusoidal oscillations with an upper and a lower half-cycle and zero crossings.

The counter may be designed to count pulses. Alternatively, it may be designed to count exclusively the positive flank or the negative flank. It may be designed to count the positive and the negative flank.

In another embodiment, the counter is designed to count zero crossings of an oscillation. Alternatively, it may be designed to count a complete sinusoidal oscillation with an upper and a lower half-cycle.

The counter may be a high-speed counter.

In one embodiment, the counter can be switched off. The counter can thus be switched off as soon as the phase locked loop is locked. This advantageously reduces the power consumption and the phase noise of the oscillator signal. The counter can be switched on and off.

In one embodiment, the circuit arrangement has a logic unit. The frequency divider in this embodiment has a second output, which is coupled to a second input of the logic unit. The logic unit is designed to emit an output signal from the logic unit at one connection.

In one embodiment of the invention, the output of the phase detector is coupled to a first input of the logic unit. In a second embodiment, the output of the charge pump is connected to the first input of the logic unit.

In a third embodiment of the development, the reference oscillator signal which can be tapped off on the output side of the reference oscillator or at the second input of the phase detector is supplied to the first input of the logic unit.

In the three embodiments of the logic unit, the frequency divider is designed to emit a delayed signal at the second output, with an adjustable delay time with respect to a signal at the first output. If, at the time when the delayed signal is emitted at the second output of the frequency divider, the charge pump is in an operating state such that it is emitting a signal at its output whose amplitude or pulse level has a magnitude higher than the signal in the rest state, then an output signal from the logic unit can be tapped off at the connection of the logic unit, and represents information that, according to the logic unit, the phase locked loop is not in a locked state. If the charge pump is in the rest state at the time at which the delayed signal has a pulse, then an output signal from the logic unit represents information that, according to the logic unit, the phase locked loop is in a locked state.

In one embodiment, the frequency divider has at least one further output for emitting at least one further delayed signal. The logic unit is connected at at least one further input to the at least one further output of the frequency divider. The logic unit is designed to emit at least one further output signal from the logic unit at one connection of the logic unit. The pulse length of the signal which can be derived from the phase signal can thus be detected more accurately.

In one embodiment, the frequency divider has a radio-frequency counter. The input of the frequency divider and thus one input of the radio-frequency counter has the oscillator signal applied to it. The frequency divider is designed to reset the radio-frequency counter after reaching a first adjustable count, and to emit a signal at the first output of the frequency divider. The adjustable count represents the division ratio between the frequency at the input of the frequency divider and the frequency at the output of the frequency divider.

In one embodiment, the frequency divider is designed to produce a delayed signal at the second output of the frequency divider when the radio-frequency counter has reached a second adjustable count. The first adjustable count in this embodiment is greater than the second adjustable count.

In one embodiment, the logic unit has an AND gate. In another embodiment, the logic unit has an exclusive-OR gate, or XOR gate for short. The logic unit may have a bistable multivibrator circuit, or flip-flop.

In one embodiment, the counter is designed to emit a counter output signal which represents a first number N of cycles of the oscillator signal which the counter counts while the condition is satisfied that the input signal to the counter exceeds an upper threshold. The cycles of the oscillator signal may, for example, be periodically occurring pulses or oscillations of an AC voltage. In one embodiment, the charge pump is active when the input signal to the counter exceeds the upper threshold value. In one alternative embodiment, the charge pump is inactive when the input signal to the counter exceeds the upper threshold value.

A further embodiment provides for the counter to be designed to count a second number M of cycles of the oscillator signal and to emit a counter output signal which represents the second number M of cycles when the input signal is below a lower threshold value.

In another embodiment, the counter is intended to emit a counter output signal which corresponds to a first time period during which the input signal is above an upper limit value. Alternatively, the counter is designed to emit a counter output signal representing a second time period, during which the input signal is below a lower limit value.

In a further embodiment, the counter can be designed to emit an output signal such that the output signal from the counter corresponds to a duty ratio $\alpha$. The duty ratio is formed from the ratio of a third time period, during which the input signal exceeds a minimum value, and the period duration of one clock cycle of the phase signal or of the signal which is produced at the output of the charge pump. In one embodiment, the counter is designed to determine the period duration by counting.

In one embodiment, a further input of the counter can be supplied with the reference oscillator signal or with a signal which can be tapped off at the first output of the frequency divider. This can advantageously be used to define the period duration at which the measurement can be repeated.

In one embodiment, the counter is designed to emit a different duty ratio $\beta=1-\alpha$, which is calculated from the difference between unity and the duty ratio $\alpha$.

The output signal from the counter can be used to supply information about the phase locked loop for checking purposes after the production of the phase locked loop. The output signal from the counter may be used for functional checking. For this purpose, the connection of the counter can be coupled to electronics of a tester. For checking purposes, there is advantageously no need for any connection to a connection directly in the forward or backward path through the phased locked loop. A connection such as this by means of a so-called probe card which is used to make contact with connecting points of a module on a wafer, can have a greater influence on the phase locked loop to be investigated than a connection to the connection of the counter. This arrangement can thus advantageously be designed to produce the output signal from the counter which is suitable for production checking or quality control of the phase locked loop.

The output side of the counter can be connected to the first connection of the evaluation apparatus. The evaluation apparatus may be designed to process the first number N, the second number M, the first time period, the second time period, the duty ratio $\alpha$ or the duty ratio $\beta$.

The evaluation apparatus may have a memory and a computation unit coupled to it. The evaluation apparatus may be provided in order to determine whether the phase locked loop is or is not locked. It can be designed for the evaluation apparatus to produce an output signal, which represents this information, at a second connection of the evaluation apparatus. The evaluation apparatus can be designed to process a plurality of successively determined values for the first number N, specifically the further numbers L, L', for the second number M, specifically the further numbers K, K', for the first time period, for the second time period or for the duty ratio $\alpha$ or $1-\alpha$. In one embodiment, processing can be carried out by comparison of an instantaneous value made available at the input with the first value made available at the input.

The evaluation apparatus can be designed to compare a third number S1 of measured values with a first measured value, and then to produce an output signal at the output of the evaluation apparatus, which represents a locked phase locked loop, when all of the measured values differ from the first measured value by less than an adjustable limit value D. If at least one measured value differs from the first measured value by an amount greater than or equal to the adjustable limit value D, the evaluation apparatus can produce an output signal which represents a non-locked phase locked loop.

The evaluation apparatus may be designed to provide a measured value, which differs from the first measured value by more than the limit value D or by the limit value D, as a new first measured value, with which the third number S1 of measured values are compared. That measured value which is provided as the new first measured value is advantageously that which is determined at as short a time as possible after the determination of the first measured value and which differs from the first measured value by more than the limit value D or by the limit value D.

Directly successive measured values can be detected and compared. Alternatively, by way of example, every alternate measured value or every third measured value can be compared. In a further embodiment, by way of example, every alternate or every third pulse length of the pulse of the input signal of the counter is detected and compared.

The computation unit may have a microcontroller. Alternatively, the evaluation apparatus has analog elements and digital gates for calculation purposes.

In one embodiment, the input side of the evaluation apparatus is coupled to the connection of the logic unit. The evaluation apparatus can be designed to use the signal which can be tapped off at the connection of the logic unit to determine whether the phase locked loop is locked.

In one embodiment, the phase detector, the charge pump, the oscillator and the counter are formed on a semiconductor body. Optionally, the filter is additionally formed on the semiconductor body. In another embodiment, the frequency divider is additionally formed on the semiconductor body. In these embodiments, it is advantageous to use the output signal from the counter to identify very quickly whether the phase locked loop complies with the specifications during a test of the semiconductor body in a test facility which has the evaluation apparatus.

In one embodiment, the evaluation apparatus can also be provided on the semiconductor body. One advantage with this development is that it is possible to tell whether the phase locked loop is in the locked state or non-locked state during its operation.

In another embodiment of the invention, a circuit arrangement is provided which has a phase locked loop, a counter and an evaluation apparatus. The phase locked loop has a phase detector, which is followed by a charge pump. The charge pump is in turn followed by an oscillator, whose output side is coupled to a first input of the phase detector. The counter is intended to count the number of cycles of an oscillator signal from the oscillator, while a signal which is derived from a phase signal from the phase detector is at a stable logic level or an approximately stable analog level. The counter is designed to emit information about the pulse length. The evaluation apparatus is designed to compare the pulse lengths of successive pulses and to determine whether any difference is less than an adjustable limit value D.

In one embodiment, the input side of the counter is connected to one output of the phase detector, or to one output of the charge pump.

The circuit arrangement with the phase locked loop can be used in a stationary transmitting arrangement. Alternatively, the circuit arrangement with the phase locked loop can be used in a mobile radio communication appliance.

The counter may be used for functional checking of a phase locked loop. The functional check can in this case be carried out during a test of the phase locked loop on a wafer, or after the phase locked loop has been constructed in a hybrid form on a substrate.

A method for determination of a locked state of a phase locked loop comprises the following steps:

While a phase signal from a phase detector is at a stable logic level, a first number N of cycles of an oscillator signal from an oscillator is determined. After this, at least two further numbers L, L' of cycles of the oscillator signal are then determined, during which the phase signal from the phase detector is at the stable logic level.

Furthermore, the first number N and the at least two further numbers L, L' are compared.

An output signal with a value which represents a locked state of the phase locked loop is emitted when the differences between the first number N and the at least two further numbers L, L' for each of the at least two further numbers L, L' is less than an adjustable limit value D. If any difference is equal to the adjustable limit value D or greater than the adjustable limit value D, an output signal is produced, with a value which represents a non-locked state of the phase locked loop.

One advantage of this method is that it allows at least three measured values recorded successively at different times to be compared, in order to identify a locked state. This method is advantageously independent of the type of phase locked loop.

In one alternative embodiment, a signal from an output of the charge pump which follows the phase detector can be used instead of the phase signal. In this embodiment, the first number N of cycles of an oscillator signal is determined, while the signal at the output of the charge pump is at an approximately stable analog level, or alternatively is above an upper threshold value, or alternatively, in a further embodiment, is below a lower threshold value. Corresponding statements apply to the determination of at least the further number L.

In one exemplary embodiment, the limit value D is between 1 and 1024. In one embodiment, it is between 2 and 64.

One embodiment provides for a third number S1 of determination processes for the further number L to differ from the first number N by less than the limit value D before the phase locked loop is identified as being locked. The third number S1 of determination processes in one embodiment is in a range between 1 and 2048. In one preferred embodiment, it is in the range between 8 and 256. During a locking process, the phase locked loop can pass through a time interval with approximately identical pulse lengths, without yet being locked. The third number S1 is thus advantageously chosen to be sufficiently high that processes for determining the pulse lengths and/or the further number L are provided before and after the time interval with approximately equal pulse lengths.

One alternative embodiment of the method for a locked state to be determined, provides for an adjustable number of processes for determining the first number N to be carried out and for the mean value from this to be denoted as a reference value, with which the following measurements are compared.

In one embodiment, the arrangement and the method can be used irrespective of the type of phase locked loop. In one embodiment, they allow the identification of the locked or non-locked state of the phase locked loop. In one embodiment, the arrangement and the method allow monitoring of the stabilization of the phase locked loop. Since, in one embodiment, this monitoring process is carried out by means of a counter on the semiconductor body and only one output signal from the counter can be tapped off, the phase angle or frequency of the phase locked loop in this embodiment is not interfered with by direct contact with any of the lines in the phase locked loop during testing in a test environment which includes the evaluation apparatus. The arrangement and the method thus allow a good view of the response of the phase locked loop, and allow a good comparison with simulation results.

Although the invention has been illustrated and described with respect to a certain aspect or various aspects, it is obvious that equivalent alterations and modifications will occur to others skilled in the art upon the reading and understanding of this specification and the annexed drawings. In particular regard to the various functions performed by the above described components (e.g., assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising." Also, exemplary is merely intended to mean an example, rather than the best.

The invention claimed is:

1. A circuit arrangement for detection of a locking condition for a phase locked loop, comprising:
    a phase locked loop which comprises
        a phase detector configured to produce a phase signal at an output;
        a charge pump coupled at one input to the output of the phase detector; and an oscillator coupled at one input to an output of the charge pump and at an output to a first input of the phase detector, and configured to emit an oscillator signal at the output;

a counter, which comprises
an input configured to receive an input signal derived from the phase signal;
a clock input coupled to the output of the oscillator; and
an output connection configured to emit an output signal from the counter as a function of a value which represents the pulse length of the phase signal; and an evaluation apparatus which comprises a first input connection coupled to the output connection of the counter, and configured to form a first difference between a first pulse length of a first pulse and a second pulse length of a second pulse which follows the first pulse, and compare the first difference with an adjustable limit value D, and further form at least one further difference between the first pulse length and at least one further pulse length of at least one further pulse which follows the second pulse in time, and further compare at least a further difference with the adjustable limit value D, and further configured to emit an output signal from the evaluation apparatus with a value or state which represents a locked state of the phase locked loop, if the first difference and the at least one further difference are less than the adjustable limit value D.

2. The circuit arrangement of claim 1, wherein the phase locked loop further comprises a filter connected between the charge pump and the oscillator.

3. The circuit arrangement of claim 1, wherein the first input of the phase detector is preceded by a first divider for frequency division, and a second input of the phase detector is preceded by a second divider for frequency division.

4. The circuit arrangement of claim 1, wherein the counter is coupled at its input directly to the output of the phase detector, or directly to the output of the charge pump.

5. The circuit arrangement of claim 1, wherein the counter is configured to count a first number N of cycles of the oscillator signal, while the input signal exceeds an upper threshold value, and emit an output signal as a function of the count result.

6. The circuit arrangement of claim 1, wherein the counter is configured to count a second number M of cycles of the oscillator signal, while the input signal is below a lower threshold value, and emit an output signal as a function of the count result.

7. The circuit arrangement of claim 1, wherein the counter is configured to produce an output signal which represents a first time period tCP1 in which the input signal exceeds an upper limit value.

8. The circuit arrangement of claim 1, wherein the counter is configured to produce an output signal which represents a second time period tCP2, in which the input signal is below a lower limit value.

9. The circuit arrangement of claim 1, wherein the counter is configured to produce an output signal which represents a duty ratio α, which is formed from a third time period tCP3, during which the input signal exceeds a minimum value, and a period duration T of one clock cycle of the phase signal.

10. The circuit arrangement of claim 1, wherein the evaluation apparatus is further configured to produce the output signal of the evaluation apparatus with a value which represents a non-locked state of the phase locked loop if at least the first difference or the at least one further difference is greater than or equal to the adjustable limit value D.

11. A circuit arrangement for detection of a locking condition for a phase locked loop, comprising:
a phase locked loop which comprises:
a phase detector configured to produce a phase signal at an output;
a charge pump coupled at one input to the output of the phase detector;
an oscillator coupled at an input to an output of the charge pump, and configured to emit an oscillator signal at the output; and
a frequency divider connected at an input to an output of the oscillator, and at a first output to a first input of the phase detector;
a counter which comprises:
an input configured to receive an input signal derived from the phase signal;
a clock input coupled to the output of the oscillator; and
a connection configured to emit an output signal from the counter as a function of a value which represents the pulse length of the phase signal;
an evaluation apparatus which comprises a first connection coupled to the connection of the counter, and configured to compare the difference between the pulse lengths of successive pulses with an adjustable limit value D, and
a logic unit which comprises:
a first input coupled to the output of the phase detector or to the output of the charge pump;
a second input coupled to a second output of the frequency divider; and
a connection configured to emit an output signal from the logic unit.

12. The circuit arrangement of claim 11, wherein the frequency divider further comprises a radio-frequency counter connected to the input of the frequency divider and configured to emit a signal at the first output of the frequency divider when the radio-frequency counter has reached a first adjustable count, and to emit a delayed signal at the second output of the frequency divider when the radio-frequency counter has reached a second adjustable count value after emitting the signal at the first output.

13. The circuit arrangement of claim 11, wherein the evaluation apparatus is connected at a third connection to the connection of the logic unit.

14. The circuit arrangement of claim 11, wherein the counter is configured to be selectively switched on and off.

15. The circuit arrangement of claim 11, wherein the evaluation apparatus further comprises a memory and a computation unit, wherein the computation unit is connected to the memory and to at least the first connection of the evaluation apparatus.

16. The circuit arrangement of claim 11, wherein the evaluation apparatus is further configured to emit an output signal from the evaluation apparatus at a second connection.

17. A circuit arrangement, comprising:
a phase locked loop, comprising a phase detector, a charge pump downstream from the phase detector, and an oscillator which is connected downstream from the charge pump and is coupled on the output side to a first input of the phase detector;
a counter configured to count the cycles of an oscillator signal from the oscillator while a signal derived from a phase signal from the phase detector is at a stable logic level or an approximately stable analog level, and configured to output a pulse length of the phase signal; and
an evaluation apparatus configured to compare at least two differences between the pulse lengths of successive pulses from the counter with an adjustable limit value D.

18. The circuit arrangement of claim 17, wherein the counter is connected on the input side directly to an output of the phase detector, or directly to an output of the charge pump.

19. A method for determination of a locked state of a phase locked loop, comprising:
   determining a first number N of cycles of an oscillator signal from an oscillator while an input signal derived from a phase signal from a phase detector exceeds a first threshold value;
   determining at least two further numbers L, L' of cycles of the oscillator signal while the input signal exceeds the first threshold value;
   comparing the first number N and the at least two further numbers L, L' and providing an output signal from an evaluation apparatus having a first value which represents a locked state of the phase locked loop if each of the at least two further numbers L, L' differs from the first number N by less than an adjustable limit value D, and having a second value which represents a non-locked state of the phase locked loop if one of the at least two further numbers L, L' differs from the first number N by the adjustable limit value D or by more than the adjustable limit value D; or
   determining a second number M of cycles of the oscillator signal while the input signal derived from the phase signal from the phase detector is below a second threshold value;
   determining at least two further numbers K, K' of cycles of the oscillator signal while the input signal is below the second threshold value;
   comparing the second number M and the at least two further numbers K, K' and providing an output signal from the evaluation apparatus having a first value which represents a locked state of the phase locked loop if each of the at least two further numbers K, K' differs from the second number M by less than an adjustable limit value D, and having a second value which represents a non-locked state of the phase locked loop if one of the at least two further numbers K, K' differs from the second number M by the adjustable limit value D or by more than the adjustable limit value D.

20. The method of claim 19, wherein if one of the at least two further numbers L, L' differs from the first number N by the adjustable limit value D or by more than the adjustable limit value D, the further number L, L' is stored as a new first number N of cycles of the oscillator signal, or if one of the at least two further numbers K, K' differs from the first number M by the adjustable limit value D or by more than the adjustable limit value D, the further number K, K' is stored as a new first number M of cycles of the oscillator signal.

21. The method of claim 19, wherein the input signal comprises the phase signal emitted from the phase detector or comprises a signal provided at an output of a charge pump, wherein the charge pump is downstream of the phase detector.

22. A method for determination of a locked state of a phase locked loop which comprises a phase detector, a charge pump, an oscillator and a frequency divider, comprising:
   supplying a delayed signal which is delayed with respect to a signal which the frequency divider provides during frequency division of an oscillator signal to a logic unit;
   supplying an input signal derived from a phase signal from the phase detector, to the logic unit;
   providing an output signal via the logic unit, the output signal having a first value if the input signal assumes a value which represents the charge pump in a rest state at the time of a pulse of the delayed signal, and having a second value if the input signal assumes a value which represents the charge pump in an active state at the time of a pulse of the delayed signal;
   determining a first number N of cycles of an oscillator signal from the oscillator while the input signal exceeds a first threshold value;
   determining at least one further number L of cycles of the oscillator signal while the input signal exceeds the first threshold value;
   comparing the first number N and the at least one further number L, and producing an output signal, the output signal having a first value which represents a locked state of the phase locked loop if each of the at least one further number L differs from the first number N by less than an adjustable limit value D, and having a second value, which represents a non-locked state of the phase locked loop, if one of the at least one further number L differs from the first number N by the adjustable limit value D or by more than the adjustable limit value D, or
   determining a second number M of cycles of the oscillator signal while the input signal is below a second threshold value;
   determining at least one further number K of cycles of the oscillator signal while the input signal is below the second threshold value;
   comparing the second number M and of the at least one further number K and providing an output signal, the output signal having a first value which represents a locked state of the phase locked loop if each of the at least one further number K differs from the second number M by less than an adjustable limit value D, and having a second value, which represents a non-locked state of the phase locked loop, if one of the at least one further number K differs from the second number M by the adjustable limit value D or by more than the adjustable limit value D.

23. The method of claim 22, further comprising:
   providing the output signal as a function of the output signal from the counter until the output signal is at the first value which represents the locked state of the phase locked loop, or
   providing the output signal as a function of the output signal from the logic unit.

24. The method of claim 23, further comprising switching off the counter if the output signal is at the first value, which represents the locked state of the phase locked loop.

* * * * *

UNITED STATES PATENT AND TRADEMARK OFFICE
CERTIFICATE OF CORRECTION

PATENT NO. : 7,443,247 B2  
APPLICATION NO. : 11/506508  
DATED : October 28, 2008  
INVENTOR(S) : Camuffo Page 1 of 1

It is certified that error appears in the above-identified patent and that said Letters Patent is hereby corrected as shown below:

Column 9, line 42; please replace "S" with --S1--  
Column 18, line 27; please replace "ofthe" with --of the--

Signed and Sealed this

Thirtieth Day of December, 2008

JON W. DUDAS  
*Director of the United States Patent and Trademark Office*